(12) United States Patent
Mijuskovic

(10) Patent No.: US 7,262,655 B2
(45) Date of Patent: Aug. 28, 2007

(54) HIGH BANDWIDTH RESISTOR

(75) Inventor: Dejan Mijuskovic, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 166 days.

(21) Appl. No.: 11/118,283

(22) Filed: Apr. 28, 2005

(65) Prior Publication Data
US 2006/0244526 A1    Nov. 2, 2006

(51) Int. Cl.
*H03F 1/36* (2006.01)
(52) U.S. Cl. .................. 330/86; 330/282; 330/308
(58) Field of Classification Search .............. None
See application file for complete search history.

(56) References Cited
U.S. PATENT DOCUMENTS
4,216,434 A * 8/1980 Wermuth ................ 330/86

6,307,433 B1 * 10/2001 Ikeda ..................... 330/86

* cited by examiner

*Primary Examiner*—Khanh Van Nguyen
(74) *Attorney, Agent, or Firm*—Ingrassia Fisher Lorenz

(57) ABSTRACT

A transimpedance amplifier is provided which includes a feedback path. The feedback path includes a feedback resistor and a voltage generator. The feedback resistor has a parasitic capacitance associated therewith. The feedback resistor also has a first node at a first voltage. The voltage generator can be capacitively coupled to the feedback resistor at a second node via the parasitic capacitance. The voltage generator is configured to generate a second voltage at the second node which is substantially equal to the first voltage. This prevents a current from flowing through the parasitic capacitance thereby reducing and/or eliminating the effect of the parasitic capacitance on the transimpedance amplifier.

18 Claims, 3 Drawing Sheets

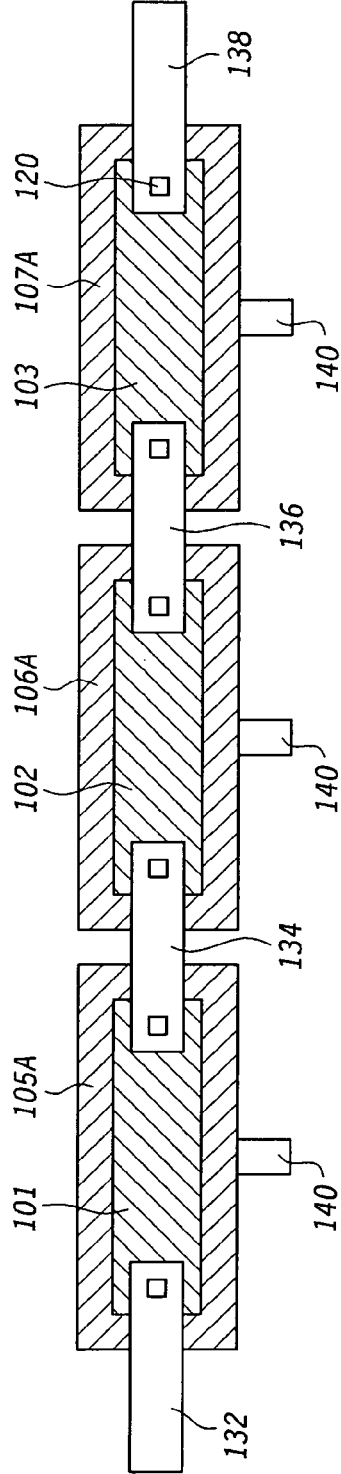
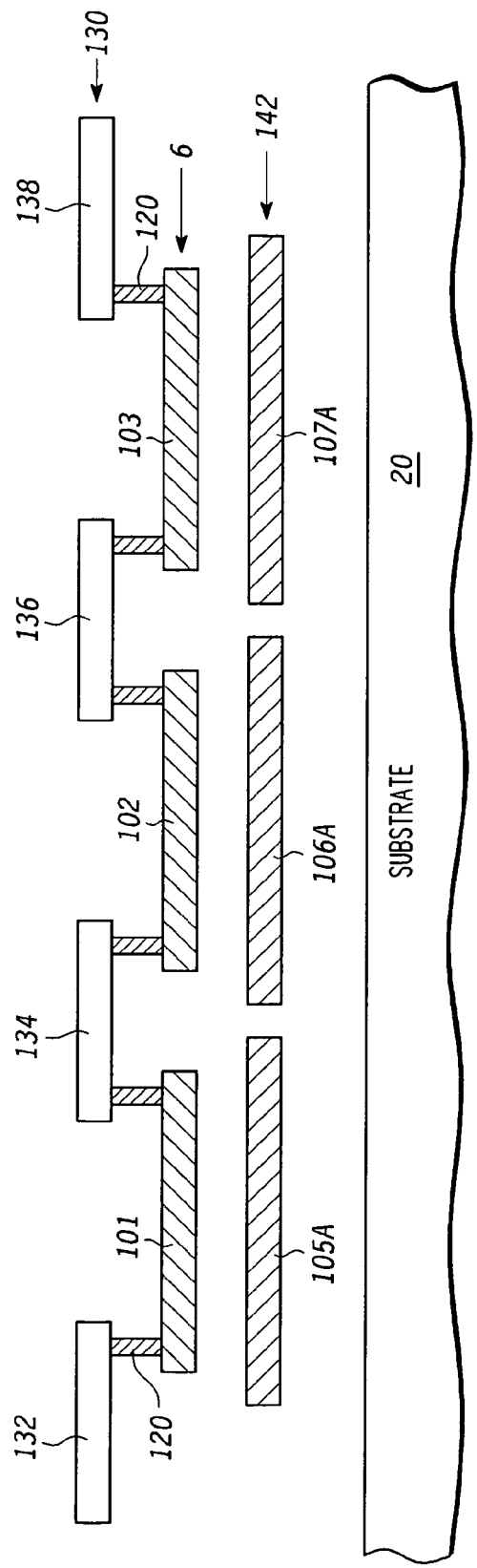

HIGH BANDWIDTH RESISTOR

TECHNICAL FIELD

The present invention generally relates to optical communications, and more particularly relates to transimpedance amplifiers.

BACKGROUND

Optical networks use light signals to transmit data over a network. Although light signals are used to carry data, the light signals are typically converted into electrical signals in order to extract and process the data. The conversion of an optical signal into an electrical signal is often achieved utilizing an optical receiver. An optical receiver converts the optical signal received over the optical fiber into an electrical signal, amplifies the electrical signal, and converts the electrical signal into a digital data stream.

Burst-mode Passive Optical Networks (BPON) are widely used in the cable industry for transmission of optical light signals from an optical transmitter at a home to an optical module located at the hub/curb. Typical optical light signals used in BPON applications can have a frequency of a 155 Mbps or greater. The use of burst-mode techniques requires fast and accurate handling of the in-coming signals by the optical line termination and accurate handling of the optical power levels both on the transmitter and the receiver sides. An optical module typically includes an optical receiver that includes a photodiode and a transimpedance amplifier. The transimpedance amplifier amplifies an input current signal from a photodiode into a relatively large amplitude output voltage signal.

FIG. 1 is a circuit diagram of a conventional optical receiver module that includes a photodiode 2 and a transimpedance amplifier 1 which converts an input current (Iin) into an output voltage (Vout). The transimpedance amplifier 1 includes a feedback resistor 6 and a high gain voltage amplifier 8.

The photodiode 2 is typically located outside a chip. A cathode of the photodiode 2 is biased via the amplifier 8. The photodiode 2, coupled between node A (ground) and node B, detects an incoming optical light signal of sufficient strength and converts the light signal into an input current (Iin) by causing the input current (Iin) to flow from the voltage amplifier 8. The input current (In) generated by voltage amplifier 8 is proportional to the optical power which impinges on the photodiode 2. In one implementation, no light generates no input current (Iin) which corresponds to a logic 0, whereas a sufficient digital light signal impinging on the photodiode 2 generates an input current flow (Iin) which corresponds to a logic 1. Node B couples the photodiode 2 to the feedback resistor 6 and the voltage amplifier 8.

The photodiode 2 has diode capacitance 4 associated with it which represents the parasitic capacitance between the photodiode 2 and other components in a chip such as pins and pads from node B to ground.

The voltage amplifier 8 is coupled between node B and node C and in parallel with the feedback resistor 6. The voltage amplifier 8 can be a large gain amplifier in which the gain (-A) ranges from 100 to 1000 or more. The voltage amplifier 8 also has a relatively large impedance on the order of 100 kOhm. The voltage amplifier 8 generates an output voltage (Vout) at node C which is the output of the voltage amplifier 8. The magnitude of the output voltage (Vout) is approximately equal to the product of the input current (Iin) and the value of the feedback resistor 6. The output voltage (Vout) can then be converted into a digital data stream.

A feedback loop in this circuit includes the feedback resistor 6 coupled in parallel across an input terminal (node B) and output terminal (node C) of the voltage amplifier 8. The feedback resistor 6 carries a current to the voltage amplifier 8. The input current (Iin) applied to the voltage amplifier is passed substantially through the feedback resistor 6 because of the high input impedance of the voltage amplifier 8. When the photodiode 2 draws the input current (Iin), the output voltage (Vout) at the feedback resistor 6 rises such that feedback resistor 6 provides the input current (Iin). The input current (Iin) flows from node C to node B across feedback resistor 6. The feedback resistor 6 helps improve the SNR which is approximately proportional to the square root of the value of the feedback resistor 6. The feedback loop must be stable, otherwise the circuit will tend to oscillate. As such, it is desirable to eliminate phase shift contributions from other parts of the loop such as parasitic capacitance associated with the feedback resistor 6.

The light signals received by the transimpedance amplifier 1 can vary significantly in both amplitude and power. The power of the light signal is often related, for example, to the length of the optical fiber over which the light signal was transmitted, the laser source power, the efficiency of the photodiode, etc. These and other factors result in light signals whose incident power at the transimpedance amplifier can vary significantly. Because the current (Iin) generated by the photodiode 2 is approximately proportional to the light which impinges on the cathode of the photodiode 2, in some cases the input signal (Iin) can be weak. Accordingly, it is desirable to minimize or reduce noise in the circuit so that the signal-to-noise ratio (SNR) is not too low.

The transimpedance amplifier 1 can successfully receive and amplify light signals which fall within a particular power range. Some of the existing standards require that the transimpedance amplifier 1 can detect an incoming optical light signal transmitted from distances up to 20 km away and having an optical power of -33 dBm. To accommodate such a wide range of optical signals, the transimpedance amplifier 1 should be able to detect and amplify very low levels and high levels of optical power. The range of signals that can be successfully amplified is therefore effectively limited by the incident optical power of the light signal. The optical receiver might distort signals whose optical power is too large and might not recognize signals whose optical power is too low. It is desirable to provide a transimpedance amplifier having increased sensitivity to incoming optical signals.

A conventional integrated circuit includes a conductive substrate having a number of metal layers and insulation layers deposited thereon. The layers can be arranged such that the metal layers are separated from one another and the substrate by insulation layers. The insulation layers can be made of a glass such as silicon dioxide. In such an arrangement, the feedback resistor can be made of a tungsten or a polysilicon layer, for example, and is disposed within an insulation layer. Typically, there will be no metal underneath the feedback resistor so a parasitic capacitance develops between the feedback resistor and the conductive substrate. This parasitic capacitance is proportional to the common area between the feedback resistor and the metal layer, and increases as the area or length of the feedback resistor increases. Thus, as the resistance of feedback resistor increases, the parasitic capacitance associated with the feedback resistor 6 also increases.

To achieve greater gain and sensitivity in the transimpedance amplifier 1, the resistance of the feedback resistor 6 is typically increased. Increasing the value of the feedback resistor 6 helps increase the SNR since the output signal (Vout) increases proportionally to the increase in the value of feedback resistor 6. By contrast, the noise generated by feedback resistor 6 increases proportionally to the square root of the feedback resistor 6. However, increasing the resistance of the feedback resistor 6 has several drawbacks.

For example, resistors manufactured utilizing semiconductor technology processes have a parasitic capacitance associated with them. This can introduce an undesirable phase shift to the transimpedance amplifier 1. As such, the larger the semiconductor area of the feedback resistor 6, the larger the associated parasitic capacitance between the feedback resistor 6 and another metal layer. This parasitic capacitance effectively adds poles to the circuit. Additional poles can make the system difficult to control due to consumption of phase margin. A larger parasitic capacitance thus reduces the bandwidth of the transimpedance amplifier. If the parasitic capacitance increases too much, then the circuit can become unstable. Thus, although it is desirable to use a high resistance feedback resistor 6 to increase the SNR, increasing the area of the feedback resistor 6 increases the parasitic capacitance which can consume valuable phase margin and reduce bandwidth of the transimpedance amplifier 1. Techniques are needed to deal with the increasing resistance values of the feedback resistor 6.

Accordingly, it is desirable to provide a transimpedance amplifier with sufficient signal-to-noise ratio, which is not influenced by the parasitic capacitance associated with the feedback resistor in the transimpedance amplifier. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

FIG. 6 is a top view of a portion of an integrated circuit according to one embodiment of the invention showing various metal layers which can be used to implement features of the transimpedance amplifier shown in FIGS. 4 and 5; and FIG. 7 is a cross sectional diagram of a portion of the integrated circuit shown in FIG. 6.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For the sake of brevity, conventional techniques related to signal processing, data transmission, signaling, network control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description refers to nodes or features being "connected" or "coupled" together. As used herein, unless expressly stated otherwise, "connected" means that one node/feature is directly or indirectly connected to another node/feature, and not necessarily mechanically. Likewise, unless expressly stated otherwise, "coupled" means that one node/feature is directly or indirectly coupled to another node/feature, and not necessarily mechanically. Thus, although the schematics shown in some of the drawings depict exemplary arrangements of elements, additional intervening elements, devices, features, or components may be present in an actual embodiment (assuming that the functionality of the circuit is not adversely affected).

Figure 1:
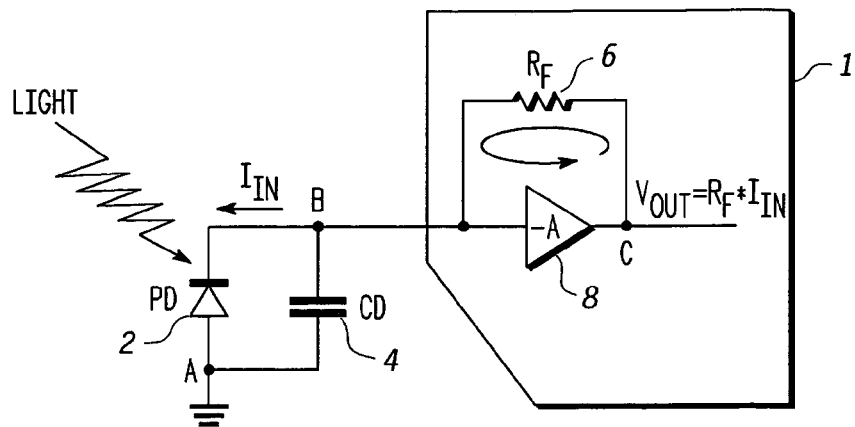
FIG. 1 is a circuit diagram of a conventional transimpedance amplifier.
Figure 2:
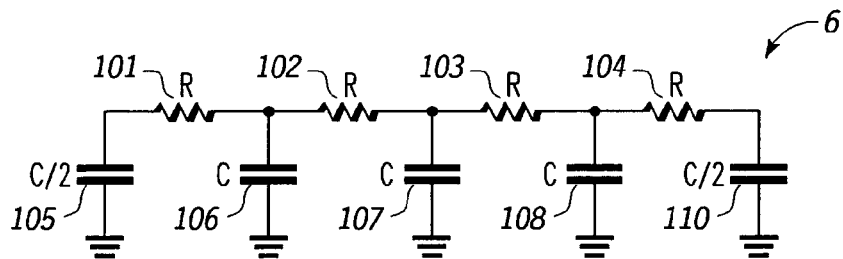
FIG. 2 is a lumped-model circuit diagram of the feedback resistor shown in FIG. 1.

FIG. 2 is a lumped-model circuit diagram of the feedback resistor 6 which approximates operation of a distributed RC circuit. This diagram of the feedback resistor 6 approximates the transmission line behavior of the feedback resistor 6 and shows a parasitic capacitance 105-110 between a grounded substrate and the resistive sections 101, 102, 103, 104 of the feedback resistor 6. Although the feedback resistor 6 and its associated parasitic capacitances are shown as comprising four resistive sections 101, 102, 103, 104 and five capacitive sections 105, 106, 107, 108, 110, respectively, it should be appreciated that the model of the feedback resistor 6 could include any number of resistive sections 101, 102, 103, 104 and the model of the parasitic capacitance could include any number of capacitive sections 105, 106, 107, 108, 110.

In this simplified model of the feedback resistor 6, the feedback resistor 6 is shown as being split into a series of resistive sections 101, 102, 103, 104, and the parasitic capacitance between feedback resistor 6 and ground can be represented as a plurality of full-capacitive sections (C) 106, 107, 108 and a pair of half-capacitive sections (C/2) 105, 110. In this model, each terminal of the resistive sections 101, 102, 103, 104 includes a half-capacitive section (C/2) coupled thereto. As such, at locations where two resistive sections are connected, the half-capacitive sections (C/2) sum to a full-capacitive sections (C) 106, 107, 108. In this model of feedback resistor 6, the capacitive section 105 is coupled between a terminal of resistive section 101 and ground, the capacitive section 106 is coupled between terminals of resistive sections 101 and 102 and ground, the capacitive section 107 is coupled between terminals of resistive sections 102 and 103 and ground, the capacitive section 108 is coupled between terminals of resistive sections 103 and 104 and ground, and the capacitive section 110 is coupled between a terminal of resistive section 104 and ground. Each of the parasitic capacitive sections 105-110 introduces some unwanted, additional phase shift into the feedback loop which consumes valuable phase margin.

Figure 3:
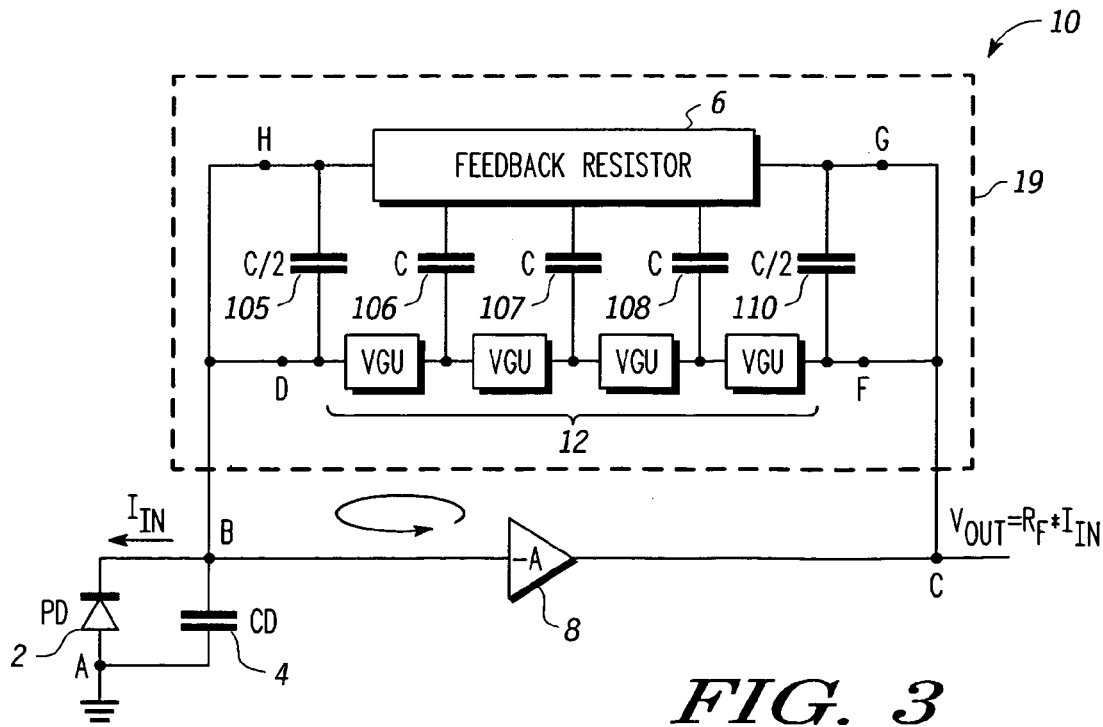
FIG. 3 is a circuit diagram of a transimpedance amplifier according to an exemplary embodiment.

FIG. 3 is a circuit diagram of an optical receiver module that includes a photodiode 2 and a transimpedance amplifier 10 which can include, a large gain voltage amplifier 8 and a feedback path 19 coupled between the amplifier 8 and the photodiode 2.

The photodiode 2 is coupled between node A and node B and to the feedback path 19 at node B. The photodiode 2 is configured to generate an input current (Iin) responsive to an optical signal received from a fiber (not shown). The input current (Iin) is generated at node B. The diode capacitance 4 represents the parasitic capacitance between photodiode 2 and ground, and is shown as being coupled between node A and node B.

The amplifier 8 is coupled to the photodiode 2 at node B and is configured to generate an output voltage (Vout) at node C that is approximately equal to the product of the input current (Iin) and the impedance of the feedback path 19.

The feedback path 19 is provided between nodes C and B. It should be noted that node B can alternatively be grounded, or connected to ground via capacitor (not shown). In one embodiment, the feedback path 19 includes a voltage generator 12 coupled between nodes D and F, and a feedback resistor 6 coupled between nodes H and G.

A parasitic capacitance 105, 106, 107, 108, 110 is associated with the feedback resistor 6. Various nodes or terminals of the voltage generator 12 are capacitively coupled to nodes of the feedback resistor 6 via these parasitic capacitances 105, 106, 107, 108, 110.

In the model of feedback resistor 6 shown in FIG. 2, each of the capacitive sections 105-110 is coupled between a terminal of a resistive section 101-104 and ground. To reduce or prevent each of the parasitic capacitive sections 105-110 from introducing additional phase shift into the feedback loop, the voltage generator 12 is provided.

Returning to FIG. 3, the voltage generator 12 comprises a number of voltage generation units (VGUs). Each of the VGUs of the voltage generator 12 generates appropriate voltages at the node where it is coupled to the parasitic capacitances 105, 106, 107, 108, 110. The VGUs substantially prevent a current from flowing from any node of the feedback resistor 6 through the parasitic capacitances 105, 106, 107, 108, 110 by controlling the set of voltages at each point where the parasitic capacitances 105, 106, 107, 108, 110 are coupled to the voltage generator 12 so that these voltages are substantially equal to the voltages at corresponding nodes of the feedback resistor 6. As a result, substantially no current flows through the parasitic capacitance 105, 106, 107, 108, or 110.

The voltage generator 12 can be implemented in a number of different ways. For example, in one embodiment, the feedback resistor 6 can be implemented as a feedback resistor string comprising a number of feedback resistor segments and a number of first nodes which connect each of the feedback resistor segments. Each of the first nodes has a parasitic capacitance associated therewith. The voltage generator 12 can be implemented as a generator resistor string comprising a number of generator resistor segments and a number of second nodes which connect each of the generator resistor segments. Each of the first nodes has a corresponding second node, and is capacitively coupled to the corresponding second node via a parasitic capacitance. The ratio of each of the feedback resistor segments to each of the generator resistor segments is selected to generate the same voltages at each first node and its corresponding second node. In one implementation, the generator resistor string can be driven by a driver such that the voltage differences between each of the first nodes and their corresponding second nodes are approximately zero so that substantially no current flows through the parasitic capacitances.

Figure 4:
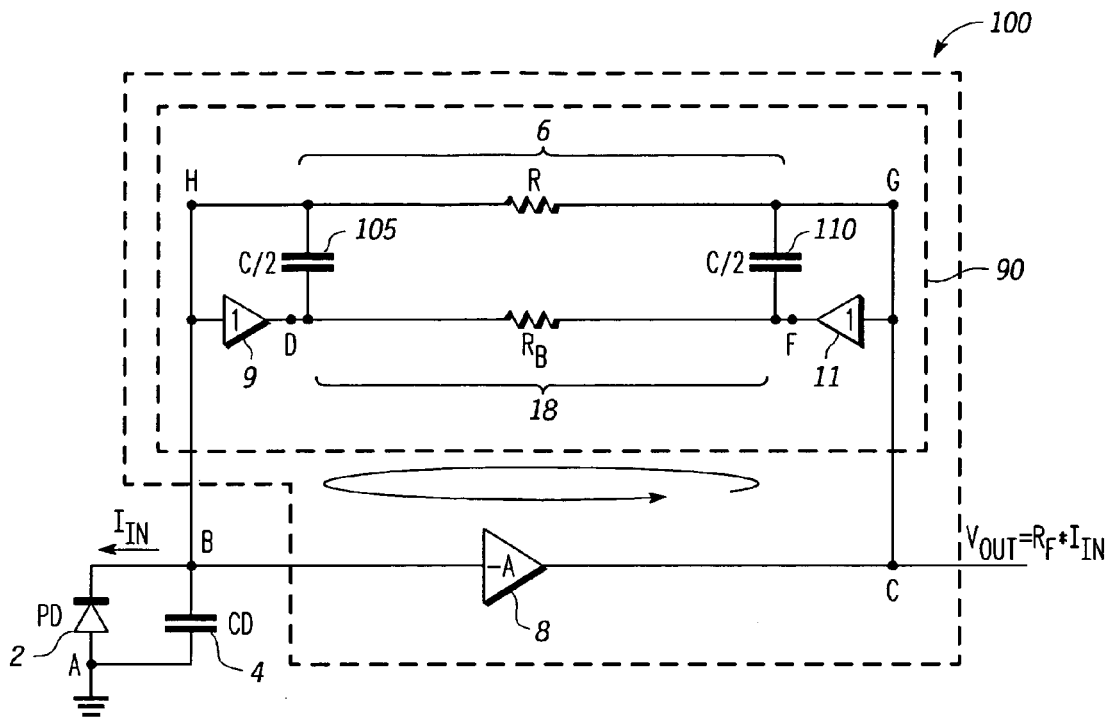
FIG. 4 is a circuit diagram of a transimpedance amplifier according to another exemplary embodiment.

FIG. 4 is a circuit diagram of a transimpedance amplifier 100 according to an exemplary embodiment in which the feedback path 90 includes a feedback resistor 6 and a voltage generator 12 comprising a generator resistor 18 and a pair of unity gain buffers 9, 11.

The feedback resistor 6 has a parasitic capacitance 105, 110 associated therewith which is modeled as a pair of capacitors (C/2) 105, 110. The feedback resistor 6 also has a node H at a first voltage.

In this embodiment, the voltage generator 12 can be implemented as a generator resistor 18 and a pair of unity gain buffers 9, 11.

The first unity gain buffer 9 has a first input at node B and a first output at node D, and the second unity gain buffer 11 has a second input at node C and a second output at node F. The unity gain buffers 9 and 11 drive the generator resistor 18. The first and second unity gain buffers 9,11 are configured to drive the generator resistor 18 such that voltage values at each end or terminal of each of the parasitic capacitances 105, 110 are substantially the same. This reduces the effect of the parasitic capacitance. For example, the voltage at node H is the same as the voltage at node D, the voltage at node G is the same as the voltage at node F, and so on. Because the voltage across the parasitic capacitances 105, 110 does not change, the parasitic capacitances 105, 110 do not conduct a current. As such, the generator resistor 18 can prevent a current from flowing to the parasitic capacitances 105, 110 such that they have no effect on transfer function of the circuit. The effect of the parasitic capacitances 105, 110 on the gain and the phase shift of the transimpedance amplifier 1 can be reduced and virtually eliminated.

The generator resistor 18 is capacitively coupled to the feedback resistor 6 via the parasitic capacitance 105, 110. The generator resistor 18 has a node D at a second voltage which is substantially equal to the first voltage. As a result, the generator resistor 18 substantially prevents a current from flowing through the parasitic capacitance 105 by controlling the first voltage so that it is substantially equal to the second voltage. As a result, substantially no current flows through the parasitic capacitance 105. A similar effect occurs with respect to the parasitic capacitance 110 which is coupled between the feedback resistor 6 and the generator resistor 18 at nodes G and F. In one implementation, the resistance of the generator resistor 18 is substantially less than the resistance of the feedback resistor 6.

Figure 5:
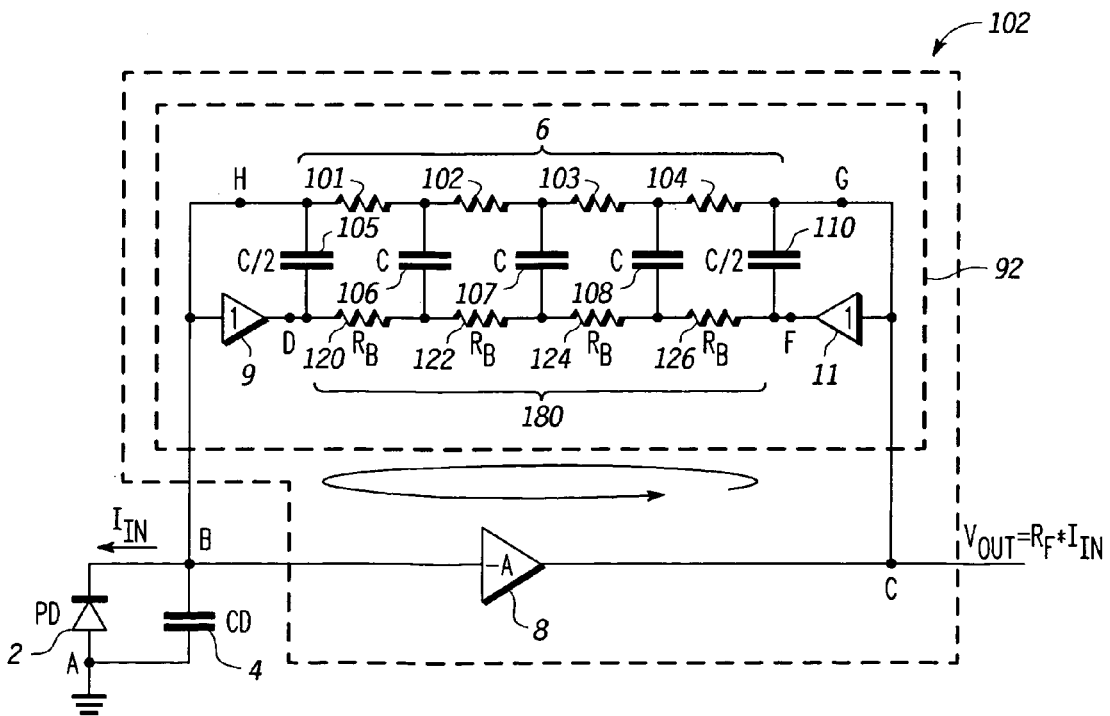
FIG. 5 is a circuit diagram of a transimpedance amplifier according to yet another exemplary embodiment.

FIG. 5 is a circuit diagram of a transimpedance amplifier 102 according to another exemplary embodiment in which the feedback path 92 comprises a first unity gain buffer 9, a second unity gain buffer 11 and a ladder circuit.

The first unity gain buffer 9 has a first input at node B and a first output at node D, and the second unity gain buffer 11 has a second input at node C and a second output at node F.

The ladder circuit can include, for example, a feedback resistor 6 and a generator resistor 180. The ladder circuit can be modeled as comprising a feedback resistor 6 comprising plurality of first resistive segments 101, 102, 103, 104 with an associated parasitic capacitance comprising plurality of parasitic capacitances 105, 106, 107, 108, 110, and a generator resistor 180 comprising a plurality second resistive segments 120, 122, 124, 126.

The feedback path 92 can be coupled in parallel with the amplifier 8 between the first input at node B and the second input at node C. The values of feedback resistor 6 should preferably be selected to improve the SNR of the transimpedance amplifier 1. In one embodiment, the feedback resistor has a value between 30 kOhms and 90 kOhms, and in another embodiment the feedback resistor has a value greater than or equal to 80 kOhms. In one embodiment, discussed below with reference to FIG. 6, the generator resistor 180 is disposed below the feedback resistor 6.

In one embodiment, the feedback resistor 6 can be modeled as comprising a plurality of first resistive segments 101, 102, 103, 104 with an associated parasitic capacitance comprising plurality of parasitic capacitances 105, 106, 107, 108, 110. In this model of the feedback resistor 6, the parasitic capacitance 105 is coupled between a terminal of first resistive segment 101 and node D which connects to a terminal of second resistive segment 120, the parasitic capacitance 106 is coupled between terminals of first resistive segments 101 and 102 and terminals of second resistive segments 120 and 122, the parasitic capacitance 107 is coupled between terminals of first resistive segments 102 and 103 and terminals of second resistive segments 122 and 124, the parasitic capacitance 108 is coupled between terminals of first resistive segments 103 and 104 and terminals of second resistive segments 124 and 126, and the parasitic capacitance 110 is coupled between a terminal of first resistive segment 104 and a terminal of second resistive segment 126 and to node F and node G.

The parasitic capacitance between feedback resistor 6 and other metal layers in the circuit can be modeled as comprising a plurality of capacitive sections 105, 106, 107, 108, 110. Each section of the parasitic capacitance 105-110 has a first end or terminal coupled to a first node and a second end. For example, the parasitic capacitance 105 has a first end or terminal coupled to a node H and a second end or terminal coupled to node D. As noted above with respect to FIG. 2, an unwanted phase shift is typically introduced due to the parasitic capacitances 105, 106, 107, 108, 110.

The generator resistor 180 can be coupled between the first and second outputs and is capacitively coupled with the feedback resistor 6 via the capacitive sections 105-110. The generator resistor 180 is coupled between node D and node F and is used to control voltages at those nodes so that the effect of the parasitic capacitances 105, 106, 107, 108, 110 can be substantially reduced and/or eliminated. It should be appreciated that the generator resistor 180 is not a "grounded" shield since it is not tied to ground. In some implementations, the generator resistor 180 is substantially smaller in value than the feedback resistor 6.

In one embodiment, the generator resistor 180 can be modeled as comprising a plurality of second resistive sections or segments 120-126 corresponding to the plurality of first resistive sections or segments 101-104. Each of the second sections 120-126 can provide substantially the same resistive divisions as the corresponding first sections 101-104 of the feedback resistor 6. In some implementations, the resistive value of each second section 120-126 of the generator resistor 180 is substantially less than the resistive value of corresponding first sections 101-104 of the feedback resistor 6; however, the ratio of the resistive value of each second section 120-126 of the generator resistor 180 to the resistive value of corresponding first sections 101-104 of the feedback resistor 6 should be selected such that the same voltage will be generated at corresponding nodes of the generator resistor 180 and the feedback resistor 6. Each of the second resistive sections 120-126 can be driven with arbitrary voltages nominally equal to the voltages of at corresponding first resistive sections 101-104 of the feedback resistor 6. For example, the generator resistor 180 helps ensure that the potential at node H is the same as the potential at node D.

The unity gain buffers 9 and 11, coupled to node D and node F, drive the generator resistor 180. The first and second unity gain buffers 9,11 are configured to drive the generator resistor 180 such that voltage values at each end of the parasitic capacitance 105-110 are substantially the same. This reduces the effect of the parasitic capacitance. For example, the voltage at node H is the same as the voltage at node D, the voltage at node G is the same as the voltage at node F, and so on. Because the voltage across the parasitic capacitances 105-110 does not change, the parasitic capacitances 105-110 do not conduct a current. As such, the generator resistor 180 can prevent a current from flowing to the parasitic capacitances 105-110 such that they have no effect on transfer function of the circuit. The effect of the parasitic capacitances 105-110 on the gain and the phase shift of the transimpedance amplifier 1 can be reduced and virtually eliminated.

Thus, the feedback resistor 6 substantially operates as an ideal resistor since the effect of the parasitic capacitances 105, 106, 107, 108, 110 is eliminated. Accordingly, adding the generator resistor 180 can effectively reduce and eliminate the unwanted phase shift from the feedback loop so that the dominant pole remains at $1/(Rf*CD)$. This allows a larger feedback resistor 6 to be used without decreasing the SNR. In one embodiment, an optical receiver which implements the transimpedance amplifier 1 can generate a correct digital signal in response to an incoming optical signal having an optical power of −35 dBm.

FIG. 6 is a top view of a portion of an integrated circuit according to one embodiment of the invention showing various metal layers which can be used to implement features of the transimpedance amplifier shown in FIGS. 4 and 5. FIG. 7 is a cross sectional diagram of a portion of the integrated circuit shown in FIG. 6.

This portion of an integrated circuit includes an interconnect metal layer 130 comprising a plurality of interconnect sections 132, 134, 136, 138, a plurality of resistor contacts or vias 120, a feedback resistor (Rf) 6 comprising a plurality of resistive sections 101, 102, 103, a shield layer 142 comprising a plurality of shield sections 105A, 106A, 107A, and shield contacts 140. Shield contacts 140 are part of the shields 105A, 106A, 107A. The interconnect sections 132, 134, 136, 138 can be coupled to the resistive sections 101, 102, 103 by the resistor contacts 120.

To reduce or eliminate the effects of the parasitic capacitance, the shield layer 142 is disposed between the feedback resistor 6 and the substrate 20. This way the shield sections 105A, 106A, 107A of the shield layer 142 can be electrically coupled in parallel with the resistive sections 101, 102, 103 of the feedback resistor 6 layer. Resistive section 101 is shielded from a substrate (not shown) by a metal shield 105A, resistive section 102 is shielded from the substrate by a metal shield 106A, and resistive section 103 is shielded from the substrate by a metal shield 107A.

The metal shields 105A, 106A, 107A can be driven by appropriates voltage produced by a voltage generator such as that shown in FIGS. 3-5. For example, as shown in FIG. 5, the voltages generated at by each second section 120-126 of the generator resistor 180 can be used to drive the metal shields such that the same voltage will be generated at corresponding nodes of the generator resistor 180 and the feedback resistor 6. It should be appreciated that although the resistors used to construct the voltage generator are not shown in FIG. 7, nevertheless, the resistors used to construct the voltage generator could be disposed above, below or near the neighborhood of the shields 105A, 106A, 107A and above, below or near the neighborhood of the resistive sections 101, 102, 103, and further that the resistors used to construct the voltage generator can be coupled to the shields 105A, 106A, 107A.

In one embodiment, the shield layer 142 could alternatively be formed from a metal layer, such as metal layer 2 of a semiconductor process.

According to one implementation, a transimpedance amplifier is provided which includes a feedback path. The feed back path includes a feedback resistor and a voltage generator. The feedback resistor has a parasitic capacitance associated therewith. The feedback resistor has a first node at a first voltage. The voltage generator is capacitively coupled to the feedback resistor at a second node. The voltage generator is configured to generate a second voltage at the second node which is substantially equal to the first voltage. In one implementation, voltage generator comprises a generator resistor configured to substantially prevent a current from flowing through the parasitic capacitance.

According to one implementation, the transimpedance amplifier may also include an input configured to provide an input current; and an amplifier coupled to the input, configured to generate an output voltage, wherein the feedback path is coupled between the amplifier and the input.

In one implementation, feedback,path further comprises a first buffer having a first input and a first output, and a second buffer having a second input and a second output, wherein the feedback resistor is coupled between the first and second inputs and the generator resistor is coupled between the first and second outputs.

In one implementation, the parasitic capacitance has a first end and a second end, wherein the first and second buffers are configured to drive the generator resistor such that voltage values at each end of the parasitic capacitance are substantially the same to reduce the effect of the parasitic capacitance.

In one implementation, feedback resistor comprises a plurality of first sections, and wherein the generator resistor comprises a plurality of second sections corresponding to the plurality of first sections. Each of the second sections provides substantially the same resistive divisions as the corresponding first sections of the feedback resistor and are driven with voltages approximately equal to the voltages at the corresponding first sections.

In one implementation, the parasitic capacitance comprises a plurality of sections, and each section of the parasitic capacitance has a first terminal coupled to a first node and a second terminal coupled to a second node. The generator resistor prevents a current from flowing through the parasitic capacitance by controlling a first voltage at the first node so that the first voltage is substantially equal to a second voltage at the second node such that substantially no current flows through the parasitic capacitance.

According to another implementation, a transimpedance amplifier is provided comprising an input configured to provide an input current, an amplifier coupled to the input and configured to generate an output voltage, and a feedback path coupled between the amplifier and the input. The feedback path may include a first buffer having a first input and a first output, a second buffer having a second input and a second output, and a ladder circuit. The ladder circuit may include a feedback resistor, coupled between the first and second inputs, comprising a plurality of first sections, wherein a parasitic capacitance is associated with the feedback resistor; and a generator resistor, coupled between the first and second outputs and capacitvely coupled to the feedback resistor, the generator resistor comprising a plurality of second sections corresponding to the plurality of first sections. The parasitic capacitance may have a first end and a second end, wherein the first and second buffers are configured to drive the generator resistor such that voltage values at each end of the parasitic capacitance are substantially the same to reduce the effect of the parasitic capacitance. The generator resistor can be disposed below the feedback resistor. The feedback resistor may comprise a plurality of first sections, and wherein the generator resistor comprises a plurality of second sections corresponding to the plurality of first sections, and wherein each of the second sections provides substantially the same resistive divisions as the corresponding first sections of the feedback resistor. Each of the second sections can be driven with voltages approximately equal to the voltages at the corresponding first sections. Each of the parasitic capacitances can have a first terminal coupled to a first node and a second terminal coupled to a second node. The generator resistor can be configured to prevent a current from flowing through the parasitic capacitance. The generator resistor can prevent a current from flowing through the parasitic capacitance by controlling a first voltage at the first node so that the first voltage is substantially equal to a second voltage at the second node such that substantially no current flows through the parasitic capacitance.

The transimpedance amplifiers described herein may be utilized, for example, in an optical receiver of an optical module.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A transimpedance amplifier, comprising:
   a feedback path comprising:
      a feedback resistor having a parasitic capacitance associated therewith, the feedback resistor having a first node at a first voltage; and
      a generator resistor, capacitively coupled to the feedback resistor at a second node, configured to generate a second voltage at the second node which is substantially equal to the first voltage to substantially prevent a current from flowing through the parasitic capacitance.

2. The transimpedance amplifier of claim 1, further comprising:
   an input configured to provide an input current; and
   an amplifier coupled to the input, configured to generate an output voltage, wherein the feedback path is coupled between an output of the amplifier and the input.

3. The transimpedance amplifier of claim 2, wherein the feedback path further comprises:
a first buffer having a first input and a first output; and
a second buffer having a second input and a second output, wherein the feedback resistor is coupled between the first and second inputs and the generator resistor is coupled between the first and second outputs.

4. The transimpedance amplifier of claim 2, wherein the parasitic capacitance has a first end and a second end, wherein the first and second buffers are configured to drive the generator resistor such that voltage values at each end of the parasitic capacitance are substantially the same to reduce the effect of the parasitic capacitance.

5. The transimpedance amplifier of claim 1, wherein the feedback resistor comprises a plurality of first sections, and wherein the generator resistor comprises a plurality of second sections corresponding to the plurality of first sections.

6. The transimpedance amplifier of claim 5, wherein each of the second sections provides substantially the same resistive divisions as the corresponding first sections of the feedback resistor.

7. The transimpedance amplifier of claim 6, wherein each of the second sections are driven with voltages approximately equal to the voltages at the corresponding first sections.

8. The transimpedance amplifier of claim 7, wherein the parasitic capacitance comprises a plurality of sections, wherein each section of the parasitic capacitance has a first terminal coupled to a first node and a second terminal coupled to a second node.

9. The transimpedance amplifier of claim 8, wherein the generator resistor prevents a current from flowing through the parasitic capacitance by controlling a first voltage at the first node so that the first voltage is substantially equal to a second voltage at the second node such that substantially no current flows through the parasitic capacitance.

10. A transimpedance amplifier, comprising:
an input configured to provide an input current;
an amplifier coupled to the input, configured to generate an output voltage; and
a feedback path coupled between the amplifier and the input, the feedback path comprising:
a first buffer having a first input and a first output;
a second buffer having a second input and a second output; and
a ladder circuit, comprising:
a feedback resistor, coupled between the first and second inputs, comprising a plurality of first sections, wherein a parasitic capacitance is associated with the feedback resistor; and
a generator resistor, coupled between the first and second outputs and capacitvely coupled to the feedback resistor, the generator resistor comprising a plurality of second sections corresponding to the plurality of first sections.

11. The transimpedance amplifier of claim 10, wherein the parasitic capacitance has a first end and a second end, wherein the first and second buffers are configured to drive the generator resistor such that voltage values at each end of the parasitic capacitance are substantially the same to reduce the effect of the parasitic capacitance.

12. The transimpedance amplifier of claim 10, wherein the generator resistor is disposed below the feedback resistor.

13. The transimpedance amplifier of claim 10, wherein the feedback resistor comprises a plurality of first sections, and wherein the generator resistor comprises a plurality of second sections corresponding to the plurality of first sections, and wherein each of the second sections provides substantially the same resistive divisions as the corresponding first sections of the feedback resistor.

14. The transimpedance amplifier of claim 13, wherein each of the second sections are driven with voltages approximately equal to the voltages at the corresponding first sections.

15. The transimpedance amplifier of claim 14, wherein each of the parasitic capacitances has a first terminal coupled to a first node and a second terminal coupled to a second node.

16. The transimpedance amplifier of claim 15, wherein the generator resistor is configured to prevent a current from flowing through the parasitic capacitance.

17. The transimpedance amplifier of claim 16, wherein the generator resistor prevents a current from flowing through the parasitic capacitance by controlling a first voltage at the first node so that the first voltage is substantially equal to a second voltage at the second node such that substantially no current flows through the parasitic capacitance.

18. An optical module, comprising:
an optical receiver comprising a transimpedance amplifier, wherein the transimpedance amplifier comprises a feedback path comprising:
a feedback resistor having a parasitic capacitance associated therewith, the feedback resistor having a first node at a first voltage; and
a generator resistor, capacitively coupled to the feedback resistor at a second node, configured to generate a second voltage at the second node which is substantially equal to the first voltage to substantially prevent a current from flowing through the parasitic capacitance.

* * * * *